(12) United States Patent
Kemmerling

(10) Patent No.: US 7,944,225 B2
(45) Date of Patent: May 17, 2011

(54) METHOD AND APPARATUS FOR PROVIDING A TESTER INTEGRATED CIRCUIT FOR TESTING A SEMICONDUCTOR DEVICE UNDER TEST

(75) Inventor: Todd Ryland Kemmerling, Livermore, CA (US)

(73) Assignee: FormFactor, Inc., Livermore, CA (US)

( * ) Notice: Subject to any disclaimer, the term of this patent is extended or adjusted under 35 U.S.C. 154(b) by 208 days.

(21) Appl. No.: 12/239,326

(22) Filed: Sep. 26, 2008

(65) Prior Publication Data
US 2010/0079159 A1 Apr. 1, 2010

(51) Int. Cl.
*G01R 31/20* (2006.01)
(52) U.S. Cl. .................................. 324/754.07
(58) Field of Classification Search ................... 324/765, 324/754, 761–762, 760, 158.1; 257/48; 438/14–18
See application file for complete search history.

(56) References Cited

U.S. PATENT DOCUMENTS

| | | | |
|---|---|---|---|
| 3,781,683 A | 12/1973 | Freed | |
| 3,827,820 A | 8/1974 | Hoffman | |
| 4,038,599 A | 7/1977 | Bove et al. | |
| 4,455,654 A | 6/1984 | Bhaskar et al. | |
| 4,468,616 A | 8/1984 | Yoshizaki | |
| 4,523,144 A | 6/1985 | Okubo et al. | |
| 4,706,018 A | 11/1987 | Beha et al. | |
| 4,780,670 A | 10/1988 | Cherry | |
| 4,837,622 A | 6/1989 | Whann et al. | |
| 4,899,099 A | 2/1990 | Mendenhall | |
| 5,070,297 A | 12/1991 | Kwon | |
| 5,090,118 A | 2/1992 | Kwon et al. | |
| 5,103,557 A | 4/1992 | Leedy | |
| 5,148,103 A | 9/1992 | Pasiecznik, Jr. | |
| 5,162,728 A | 11/1992 | Huppenthal | |
| 5,172,050 A | 12/1992 | Swapp | |
| 5,187,020 A | 2/1993 | Kwon et al. | |
| 5,191,708 A | 3/1993 | Kasukabe et al. | |
| 5,243,274 A | 9/1993 | Kelsey et al. | |
| 5,261,155 A | 11/1993 | Angulas et al. | |
| 5,323,107 A | 6/1994 | D'Souza | |
| 5,357,523 A | 10/1994 | Bogholtz, Jr. et al. | |
| 5,363,038 A | 11/1994 | Love | |
| 5,367,254 A | 11/1994 | Faure et al. | |
| 5,389,556 A | 2/1995 | Rostoker et al. | |
| 5,406,210 A | 4/1995 | Pedder | |
| 5,422,574 A | 6/1995 | Kister | |
| 5,434,513 A | 7/1995 | Fujii et al. | |
| 5,442,282 A | 8/1995 | Rostoker et al. | |
| 5,476,211 A | 12/1995 | Khandros | |
| 5,479,105 A | 12/1995 | Kim et al. | |

(Continued)

FOREIGN PATENT DOCUMENTS

DE 9004562 * 8/1990

(Continued)

*Primary Examiner* — Ha Tran T Nguyen
*Assistant Examiner* — Tung X Nguyen
(74) *Attorney, Agent, or Firm* — Kirton & McConkie

(57) ABSTRACT

Methods and apparatus for providing a tester integrated circuit (IC) for testing a semiconductor device under test (DUT) are described. Examples of the invention can relate to an apparatus for testing a semiconductor device under test (DUT). In some examples, the apparatus can include an integrated circuit (IC) coupled to test probes configured to contact pads on the DUT, the IC including a plurality of dedicated test circuits coupled to programmable logic, the programmable logic responsive to programming data to form a tester for testing the DUT from at least one of the dedicated test circuits.

23 Claims, 5 Drawing Sheets

U.S. PATENT DOCUMENTS

| | | | |
|---|---|---|---|
| 5,491,426 A | 2/1996 | Small | |
| 5,495,667 A | 3/1996 | Farnworth et al. | |
| 5,497,079 A | 3/1996 | Yamada et al. | |
| 5,532,610 A | 7/1996 | Tsujide et al. | |
| 5,534,784 A | 7/1996 | Lum et al. | |
| 5,568,054 A | 10/1996 | Lino et al. | |
| 5,570,032 A | 10/1996 | Atkines et al. | |
| 5,600,257 A | 2/1997 | Leas et al. | |
| 5,625,297 A | 4/1997 | Arnaudov et al. | |
| 5,642,054 A | 6/1997 | Pasiecznik, Jr. | |
| 5,648,661 A | 7/1997 | Rostoker et al. | |
| 5,669,774 A | 9/1997 | Grabbe | |
| 5,670,889 A | 9/1997 | Okubo et al. | |
| 5,686,842 A | 11/1997 | Lee | |
| 5,701,085 A | 12/1997 | Malladi et al. | |
| 5,701,666 A | 12/1997 | DeHaven et al. | |
| 5,736,850 A | 4/1998 | Legal | |
| 5,764,072 A | 6/1998 | Kister | |
| 5,772,451 A | 6/1998 | Dozier, II et al. | |
| 5,806,181 A | 9/1998 | Khandros et al. | |
| 5,821,763 A | 10/1998 | Beaman et al. | |
| 5,829,128 A | 11/1998 | Eldridge et al. | |
| 5,832,601 A | 11/1998 | Eldridge et al. | |
| 5,834,946 A | 11/1998 | Albrow et al. | |
| 5,838,163 A | 11/1998 | Rostoker et al. | |
| 5,864,946 A | 2/1999 | Eldridge et al. | |
| 5,878,486 A | 3/1999 | Eldridge et al. | |
| 5,884,398 A | 3/1999 | Eldridge et al. | |
| 5,897,326 A | 4/1999 | Eldridge et al. | |
| 5,900,738 A | 5/1999 | Khandros et al. | |
| 5,917,707 A | 6/1999 | Khandros et al. | |
| 5,974,662 A | 11/1999 | Eldridge et al. | |
| 5,983,493 A | 11/1999 | Eldridge et al. | |
| 5,998,228 A | 12/1999 | Eldridge et al. | |
| 6,029,344 A | 2/2000 | Khandros et al. | |
| 6,032,356 A | 3/2000 | Eldridge et al. | |
| 6,059,982 A | 5/2000 | Palagonia et al. | |
| 6,064,213 A | 5/2000 | Khandros et al. | |
| 6,110,823 A | 8/2000 | Eldridge et al. | |
| 6,133,744 A | 10/2000 | Yojima et al. | |
| 6,174,744 B1 | 1/2001 | Watanabe et al. | |
| 6,219,908 B1 | 4/2001 | Farnworth et al. | |
| 6,275,051 B1 | 8/2001 | Bachelder et al. | |
| 6,316,988 B1 | 11/2001 | Forehand et al. | |
| 6,525,555 B1 | 2/2003 | Khandros et al. | |
| 6,535,555 B1 | 3/2003 | Bordes et al. | |
| 6,655,023 B1 | 12/2003 | Eldridge et al. | |
| 6,788,094 B2 | 9/2004 | Khandros et al. | |
| 6,856,150 B2 | 2/2005 | Sporck et al. | |
| 7,078,926 B2 | 7/2006 | Khandros et al. | |
| 7,109,736 B2 * | 9/2006 | Long | 324/765 |
| 7,116,119 B2 | 10/2006 | Sporck et al. | |
| 7,123,039 B2 * | 10/2006 | Gonzalez | 324/763 |
| 7,307,433 B2 | 12/2007 | Miller et al. | |
| 7,345,493 B2 | 3/2008 | Khandros et al. | |
| 2003/0107394 A1 | 6/2003 | Khandros et al. | |
| 2004/0068869 A1 | 4/2004 | Eldridge et al. | |

FOREIGN PATENT DOCUMENTS

| | | | |
|---|---|---|---|
| EP | 047141 | * | 3/1982 |
| EP | 699912 | * | 3/1996 |
| EP | 708338 | * | 4/1996 |
| FR | 2645679 | * | 10/1990 |
| JP | 02-159585 | | 6/1990 |
| JP | 06-180342 | | 6/1994 |
| JP | 07-111283 | | 4/1995 |
| JP | 08-37215 | * | 2/1996 |
| JP | 08-50162 | | 2/1996 |
| JP | 08/129053 | | 5/1996 |
| JP | 08-184612 | * | 7/1996 |
| WO | 91/12706 | * | 8/1991 |
| WO | 95/14314 | * | 5/1995 |
| WO | 96/08056 | * | 3/1996 |
| WO | 96-15459 | * | 5/1996 |
| WO | 98-01906 | | 1/1998 |

* cited by examiner

METHOD AND APPARATUS FOR PROVIDING A TESTER INTEGRATED CIRCUIT FOR TESTING A SEMICONDUCTOR DEVICE UNDER TEST

BACKGROUND OF THE INVENTION

1. Field of the Invention

Embodiments of the present invention relate to semiconductor testing.

2. Description of the Related Art

Testing is an important step in the production of semiconductor devices for use. Typically, partially or fully completed semiconductor devices may be tested by bringing terminals disposed on an upper surface of a device to be tested—also referred to as a device under test (or DUT)—into contact with resilient contact elements, for example, as contained in a probe card assembly, as part of a test system. A test system controller may be coupled to the probe card assembly to send and receive test signals to and from the DUTs over a set of test channels. A test system controller with increased test channels can be a significant cost factor for a test system. Test system controllers have evolved to increase the number of channels and hence the number of devices that can be tested in parallel (sometimes referred to as multi-site testing).

During testing, some test channels provide test input signals to input pins of the DUTs, others test channels monitor for test result signals from output pins of the DUTs, and still others provide test input signals to, and monitor for test result signals from, input/output (IO) pins of the DUTs. Tester logic can be coupled to the test channels for generating the test input signals and/or processing the test result signals. The tester logic can be part of the test system controller. Some tester logic can include more test circuits than are required for any one test application. Test circuits that are not used in a given test application are nevertheless present and can interfere with the intended operation of test equipment. Other tester logic, while programmable, can make implementation of certain types of test circuits inefficient, impracticable, or even impossible.

Accordingly, there exists a need in the art for a method and apparatus for testing semiconductor devices that attempts to overcome at least some of the aforementioned deficiencies.

SUMMARY OF THE INVENTION

Embodiments of the invention can relate to an apparatus for testing a semiconductor device under test (DUT). In some embodiments, the apparatus can include an integrated circuit (IC) coupled to test probes configured to contact pads on the DUT, the IC including a plurality of dedicated test circuits coupled to programmable logic, the programmable logic responsive to programming data to form a tester for testing the DUT from at least one of the dedicated test circuits.

Embodiments of the invention can relate to an apparatus for testing a semiconductor DUT. In some embodiments, the apparatus can include a probe card assembly having input terminals coupled to test probes via signal paths, the test probes configured to contact pads on the DUT; and test instruments, coupled to the input terminals, the test instruments including at least one tester IC, each of the at least one tester IC coupled to one or more of the input terminals and including: a plurality of dedicated test circuits coupled to programmable logic, the programmable logic responsive to programming data to form a tester for testing the DUT from at least one of the dedicated test circuits.

Embodiments of the invention can relate to a method for testing a semiconductor DUT. In some embodiments, the method can include loading programming data into programmable logic of a tester integrated circuit (IC), the programming data configuring the programmable logic to form a tester from at least one of a plurality of dedicated test circuits in the tester IC; and controlling the tester to perform at least one of: generating a test signal for testing the DUT or processing a test result signal produced by the DUT.

Embodiments of the invention can relate to a probe card assembly. In some embodiments, the probe card assembly can include signal paths coupled to test probes, the test probes configured to contact pads on a semiconductor device under test (DUT); and at least one tester integrated circuit (IC) coupled one or more of the signal paths and including: a plurality of dedicated test circuits coupled to programmable logic, the programmable logic responsive to programming data to form a tester for testing the DUT from at least one of the dedicated test circuits.

BRIEF DESCRIPTION OF THE DRAWINGS

So that the manner in which features of the various embodiments of the present invention can be understood in detail, a more particular description of the invention, briefly summarized above and described more fully below, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
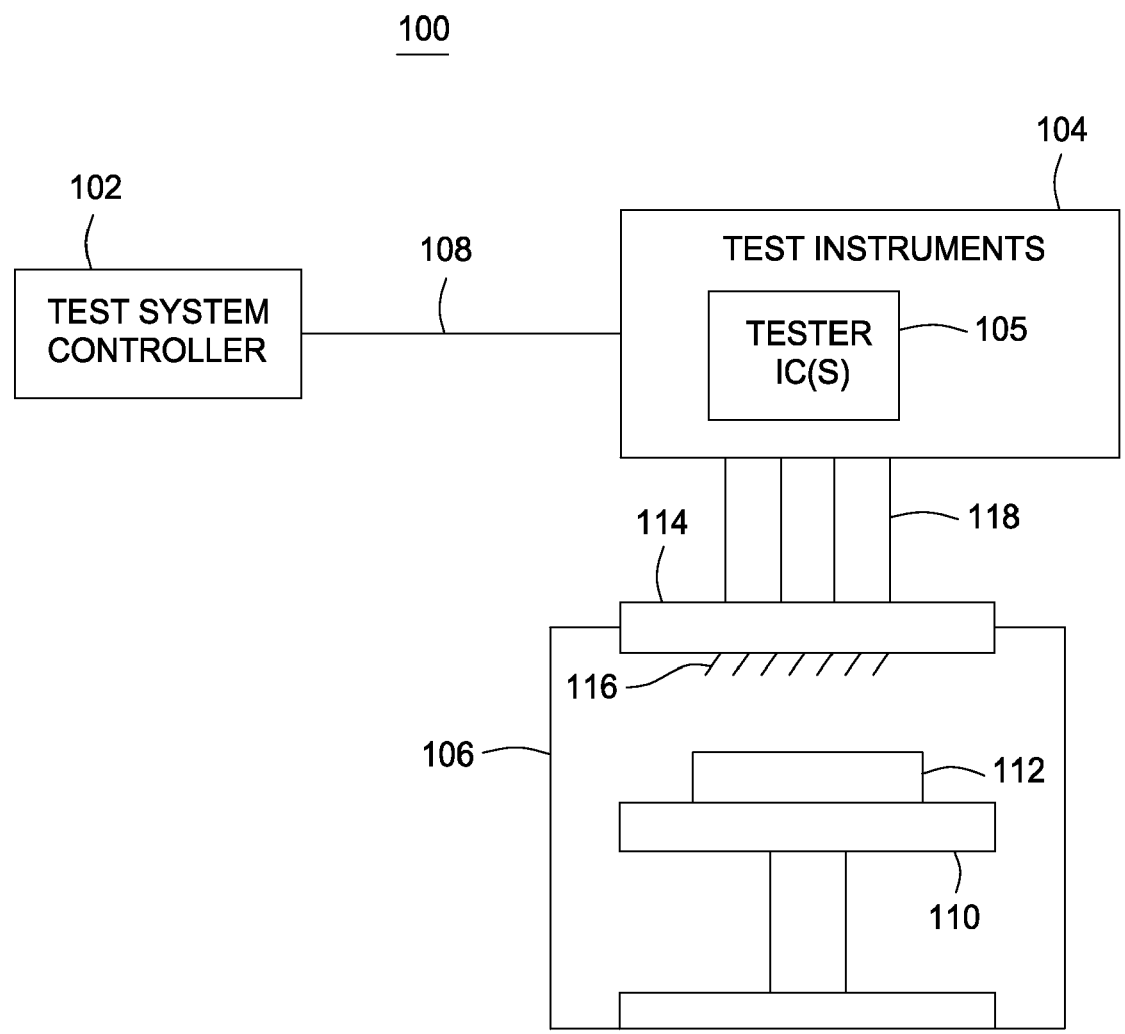
FIG. 1 depicts a test system according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, up, down, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

The present invention provides a method and apparatus for providing a tester integrated circuit (IC) for testing a semiconductor device under test (DUT). A tester IC can be implemented using an application specific integrated circuit (ASIC). In an ASIC, tester logic can be defined in one or more layers during fabrication using a set of photolithographic masks. Such tester logic can be referred to as "dedicated" or "hard-wired", since the implementation of the tester logic cannot be changed after fabrication. The ASIC may include various types of test circuits for generating and/or processing signals. The ASIC can be designed to be general enough to be used in different types of test applications, including different types of test equipment and different types of DUTs. Thus, the ASIC can include more test circuits than are required for use in any one test application. Test circuits in an ASIC that are not used in a given test application are nevertheless present and can interfere with the intended operation of the test equipment. Moreover, as noted above, an ASIC is hard-wired and the implementation of the test circuits therein cannot be changed once fabricated.

The tester IC can also be implemented using a programmable logic device (PLD), such as a field programmable gate array (FPGA). An FPGA is an integrated circuit (IC) that include programmable logic blocks and programmable interconnects, each of which can be programmed and reprogrammed after manufacture of the device to implement various logical functions. In a test system, an FPGA can be programmed and reprogrammed with different test circuits for driving the test channels. FPGAs, however, are designed to be general in order to be capable of implementing many different types of circuits across many different applications. The general design of an FPGA can make implementation of certain types of test circuits inefficient, impracticable, or even impossible. Furthermore, test circuits implemented in an FPGA may be slower, require more chip area, and/or consume more power as compared to test circuits implemented using an ASIC.

Aspects of the invention can relate to an IC coupled to test probes for contacting the DUT. A tester IC can include a plurality of dedicated test circuits coupled to programmable logic. The dedicated test circuits can be "dedicated" in that the circuits can be formed in one or more layers of the IC using photolithography and like type processes during fabrication. The programmable logic can responsive to programming data to form a tester for testing the DUT from at least one of the dedicated test circuits. The tester IC can be more versatile than a pure ASIC, as various implementations of a tester can be formed dedicated test circuits depending on test application. Moreover, dedicated test circuits that are not needed for a particular test application can be isolated from the tester implementation so as to not deleteriously affect tester operation. The tester IC can be more versatile than a pure FPGA, as some dedicated test circuits can be formed more efficiently in terms of area, speed, and power consumption than implementing such circuits using the general purpose programmable blocks of an FPGA. Moreover, the tester IC can include some test circuits that are difficult, impracticable, or impossible to form using the general purpose programmable blocks of an FPGA.

FIG. 1 depicts a test system 100 according to some embodiments of the invention. The test system 100 can generally include a test system controller 102, test instruments 104, a probe card assembly 114, and a prober 106. The test system controller 102 can be coupled to the test instruments 104 by a communication link 108. The test system controller 102 may comprise a host computer, for example. The prober 106 can include a stage 110 for mounting a device under test (DUT) 112 being tested. The DUT 112 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, can refer to one or a plurality of such electronic devices. The probe card assembly 114 can include probes 116 (also referred to as test probes) that contact the DUT 112. The stage 110 can be movable to contact the DUT 112 with probes 116.

In the test system 100, test signals can be generated by the test instruments 104 and transmitted through the probe card assembly 114, the probes 116, and ultimately to the DUT 112. Overall control of the test instruments 104 for testing may be orchestrated by the test system controller 102 (e.g., a general purpose computer). Test result signals can then provided from the DUT 112 back through the probe card assembly 114 to the test instruments 104. The test instruments 104 may transmit the test result signals to the test system controller 102 for analysis.

Test data provided from the test instruments 104 can be divided into individual test channels. The test channels can be linked by connectors 118 to the probe card assembly 114. The connectors 118 may be any suitable connectors, such as flexible cable connectors, pogo pins, zero insertion force (ZIF) connectors, or the like. The probe card assembly 114 can fan out one or more of the test channels to multiple probes 116. One or more of the test channels can be coupled to a tester that generates test data and/or processes test result data. In some embodiments, the test instruments 104 can include one or more testers, which may be implemented using one or more integrated circuits (ICs) ("tester ICs 105"). In some embodiments, the probe card assembly 114 may include one or more tester ICs 105 alternatively to, or in addition to, the test instruments 104.

Each tester IC 105 can include dedicated test circuits coupled to programmable logic. The programmable logic in a tester IC 105 can be responsive to programming data that forms at least one of the dedicated test circuits into a tester for testing the DUT. A tester formed by a tester IC 105 can generate test data and/or process test result data. Thus, each tester IC 105 can be coupled to at least one of the test channels. Exemplary embodiments of a tester IC 105 are described below.

Figure 6:
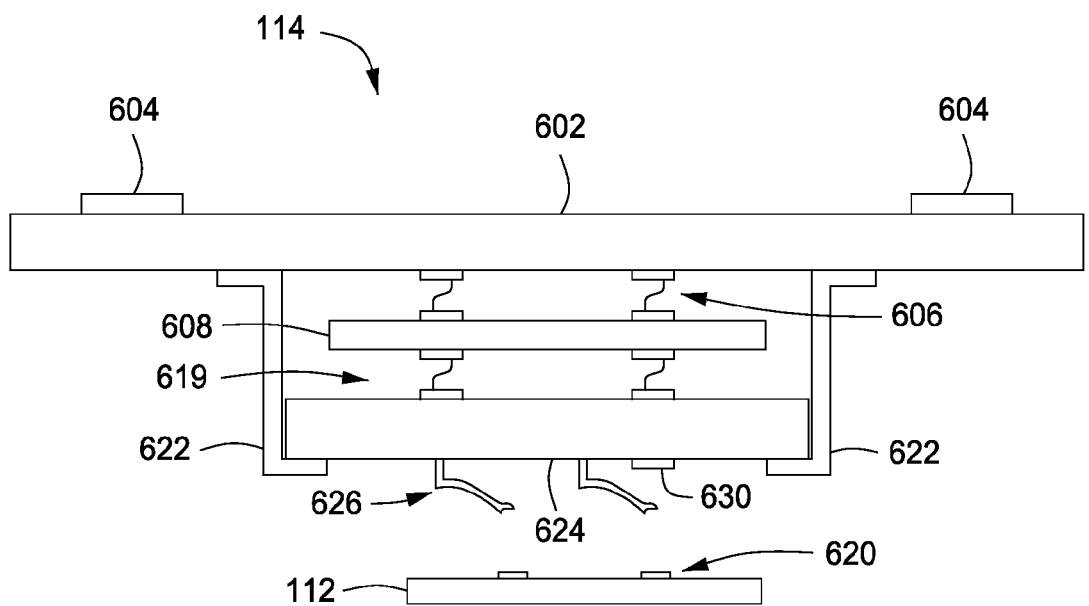
FIG. 6 depicts a probe card assembly according to some embodiments of the invention Where possible, identical reference numerals are used herein to designate identical elements that are common to the figures. The images used in the drawings are simplified for illustrative purposes and are not necessarily depicted to scale.

FIG. 6 depicts the probe card assembly 114 according to some embodiments of the invention. The probe card assembly 114 generally acts as an interface between the test instruments 104 and the DUT 112. The probe card assembly 114 can include electrical connectors 604 configured to make electrical connections with a plurality of test channels from the test instruments 104. The probe card assembly 114 can also include one or more resilient contact elements 626 as test probes. The resilient contact elements 626 can be configured to be pressed against, and thus make temporary electrical connections with, one or more input and/or output terminals 620 of the DUT 112. The resilient contact elements 626 are typically configured to correspond to desired terminals 620 of the DUT 112 and may be arranged in one or more arrays having a desired geometry.

The probe card assembly 114 may include one or more substrates configured to support the connectors 604 and the resilient contact elements 626 and to provide electrical connections therebetween. The exemplary probe card assembly 114 shown in FIG. 6 has three such substrates, although in other implementations, the probe card assembly 114 can have more or fewer substrates. In the embodiment depicted in FIG. 6, the probe card assembly 114 includes a wiring substrate 602 (also referred to as a printed wiring board), an interposer substrate 608, and a probe substrate 624 (also referred to as a probe head). The wiring substrate 602, the interposer substrate 608, and the probe substrate 624 can generally be made of any type of suitable material or materials, such as, without limitation, printed circuit boards, ceramics, organic or inorganic materials, and the like, or combinations thereof.

Additionally, the probe card assembly 114 may include one or more active or passive electronic components (such as capacitors, resistors, and the like). In some embodiments, electronics 630 can be disposed on the wiring substrate 602. The electronics 630 may be used, among other things, to implement tester ICs 105, as described in embodiments herein. In other embodiments, the electronics 630 may be disposed on the interposer 608. In still other embodiments, the electronics 630 may be disposed on the probe substrate 624 along with the resilient contact elements 626. In other embodiments, the electronics 630 can be disposed on any combination of one or more of the wiring substrate 602, the interposer substrate 608, and the probe substrate 624.

Electrically conductive paths (examples shown below) are typically provided from the connectors 604 through the various substrates and the electronics 630 to the resilient contact elements 626. For example, in the embodiment depicted in FIG. 6, electrically conductive paths may be provided from the connectors 604 through the wiring substrate 602 to a plurality of electrically conductive spring interconnect structures 606. Other electrically conductive paths may be provided from the spring interconnect structures 606 through the interposer substrate 608 to a plurality of electrically conductive spring interconnect structures 619. Still other electrically conductive paths may further be provided from the spring interconnect structures 619 through the probe substrate 624 to the resilient contact elements 626. The electrically conductive paths through the wiring substrate 602, the interposer substrate 608, and the probe substrate 624 can comprise electrically conductive vias, traces, or the like, that may be disposed on, within, and/or through the wiring substrate 602, the interposer substrate 608, and the probe substrate 624. The electronics 630 can be provided on one or more of the wiring substrate 602, the interposer substrate 608, and/or the probe substrate 624 in the path of at least some of the aforementioned electrically conductive paths, as described in embodiments below.

The wiring substrate 602, the interposer substrate 608, and the probe substrate 624 may be held together by one or more brackets 622 and/or other suitable devices (such as by bolts, screws, or other suitable fasteners). The configuration of the probe card assembly 114 shown in FIG. 6 is exemplary only and is simplified for ease of illustration and discussion and many variations, modifications, and additions are contemplated. For example, a probe card assembly may have fewer or more substrates (e.g., 602, 608, 624) than the probe card assembly 114 shown in FIG. 6. As another example, a probe card assembly may have more than one probe substrate (e.g., 624), and each such probe substrate may be independently adjustable. Non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 114 shown in FIG. 6 and that the probe card assemblies described in the aforementioned patents and application may benefit from the use of the inventive test logic and its configurations described herein.

Figure 2:
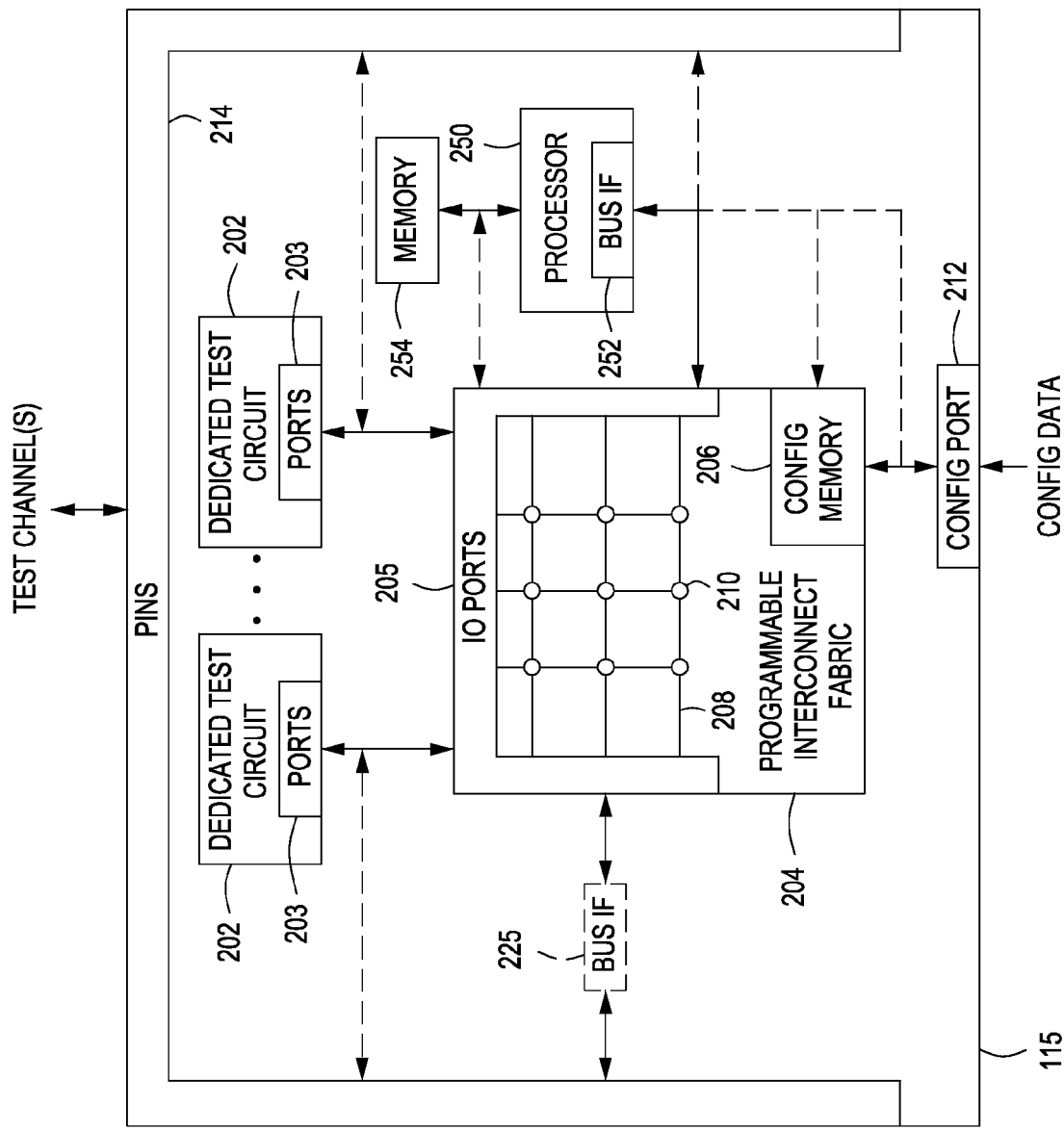
FIG. 2 is a block diagram depicting a tester IC according to some embodiments of the invention.

FIG. 2 is a block diagram depicting a tester IC 105 according to some embodiments of the invention. The tester IC 105 can include a plurality of dedicated test circuits 202 coupled to a programmable interconnect fabric 204. The dedicated test circuits 202 can be used to generate test signals for application to the DUT 112 and/or process test result signals received from the DUT 112. Each of the dedicated test circuits 202 can be defined in one or more layers (not shown) of the tester IC 105 during fabrication using photolithographic mask(s). Each of the dedicated test circuits 202 can include one or more ports 203 each of which is configured to provide output signals, receive input signals, or both.

The programmable interconnect fabric 204 can include input/output (IO) ports 205 that can be programmatically connected to one another via a network of conductor segments 208 and programmable switches 210. The programmable interconnect fabric 204 can include a configuration memory 206. The configuration memory 206 can include configuration data for establishing connections between specific ones of the IO ports 205 by configuring the programmable switches 210 to connect IO ports 205 with conductor segments 208 and/or conductor segments 208 with other conductor segments 208. At least a portion of the ports 203 of each of the dedicated test circuits 202 can be coupled to respective IO ports 205 of the programmable interconnect fabric 204.

The tester IC 105 can include pins 214, at least some of which are configured to provide output signals to test channels, receive input signals from test channels, or both. In some embodiments, the pins 214 can be coupled to respective IO ports 205 of the programmable fabric 204. In other embodiments, the pins 214 can be coupled to bus interface logic 225 in the tester IC 105, which is in turn coupled to respective IO ports 205 of the programmable interconnect fabric 204. The bus interface logic 225 can be used as an interface between a particular type of bus provided externally to the tester IC and the particular IO port configuration of the programmable interconnect fabric 204. The dedicated test circuits 202 can be accessed via the programmable interconnect fabric 204 and the pins 214 (optionally through the bus interface logic 225). In some embodiments, at least a portion of the ports 203 of the dedicated test circuits 202 can be coupled to respective ones of the pins 214 directly without traversing the programmable interconnect fabric 204.

The tester IC 105 can include a configuration port 212 for loading configuration data to the configuration memory 206. To implement tester logic, configuration data can be loaded to the configuration memory 206 via the configuration port 212, where the configuration data is designed to couple dedicated test circuit(s) 202 with other dedicated test circuit(s) 202 and/or dedicated test circuit(s) with pin(s) 214. The configuration data may be designed such that some dedicated test circuit(s) 202 and/or pin(s) 214 are not coupled to any other components (circuits and/or pins) that are being utilized. In this manner, those dedicated test circuits 202 and/or pins 214 that are not necessary for a given test application can be effectively isolated from those dedicated test circuits 202 and/or pins 214 that are required. This can minimize or eliminate any interference caused by unused test circuits 202 and/or pins 214. Various configurations of tester logic can be implemented to test DUTs across multiple test applications using the dedicated test circuits 202 as "building blocks".

The dedicated test circuits 202 can include multiple types of test circuits. Non-limiting examples of test circuits that can be implemented as the dedicated test circuits 202 include timing generators and/or timing counters, formatters, DUT interfaces (e.g., memory interfaces, processor interfaces, system on chip (SoC) interfaces, and the like), IO circuits (e.g., drivers, comparators, etc.), and algorithmic pattern generators (APGs). Various other types of circuits that can be used to test a DUT can be implemented as one or more of the dedicated test circuits 202.

The dedicated test circuits 202 can include multiple versions of a specific type of test circuit. In a non-limiting example, the dedicated test circuits 202 can include multiple versions of an IO circuit for communicating with a DUT, each designed to handle a different voltage. In another non-limiting example, the dedicated test circuits 202 can include multiple versions of an APG, each designed to generate test patterns for different DUTs. In such embodiments, the specific attribute or attributes that differ among the multiple versions of a specific test circuit are hard-wired (dedicated) within the test circuit.

In some embodiments, one or more of the dedicated test circuits 202 can be programmable. For example, one or more of the ports 203 of a particular test circuit 202 can be control ports configured to receive control signals that can program one or more attributes thereof. In a non-limiting example, the dedicated test circuits 202 can include an IO circuit for communicating with a DUT, where the IO voltage of the IO circuit can be programmed during testing (e.g., the IO voltage can be selected from a plurality of possible IO voltages). In another non-limiting example, the dedicated test circuits 202 can include an APG that can be programmed to produce different test patterns potentially across different types of DUTs. Various other types of test circuits can be implemented in the dedicated test circuits 202 to have one or more programmable attributes.

In some embodiments, the tester IC 105 can include a processor 250. The processor 250 can be a microprocessor, microcontroller, instruction-set processor, or like type device. The processor 250 can have at least one bus interface 252. At least a portion of the bus interface(s) 252 can be coupled to IO ports 205 of the programmable interconnect fabric 204. In some embodiments, at least a portion of the bus interface(s) 252 can be coupled to the pins 214 of the tester IC 105 (without traversing the programmable interconnect fabric 204). In some embodiments, the processor 250 can be used to facilitate programming of the configuration memory 206 with configuration data. For example, the processor 250 can load or otherwise control loading of configuration data into the configuration memory 206. The processor 250 can dynamically load a portion of the configuration memory 206 with different configuration data while the tester IC is active (dynamic re-programming of the programmable interconnect fabric 204). In this manner, different ones of the dedicated test circuits 202 can be incorporated and/or unincorporated into the tester logic dynamically during the testing process. The processor 250 can operate according to instructions that can be stored in memory within the processor 250 (e.g., cache memory). In some embodiments, the tester IC 105 can include a memory 254 that can be coupled to the processor 250 directly, or coupled to the programmable interconnect fabric 204 (which can be programmed to couple the memory 254 to the processor 250). The memory 254 can store instructions to be executed by the processor 250. In some embodiments, the memory 254 can store any other data and can be accessed by other circuits through the programmable interconnect fabric 204, such as the dedicated test circuits 202.

The tester IC 105 can exhibit advantages over an ASIC tester IC or an FPGA tester IC. The tester IC 105 includes a programmable interconnect fabric, which allows for specific configurations of dedicated test circuits to be constructed (and reconstructed), in some embodiments dynamically, for particular test applications. In contrast, an ASIC tester IC is hard-wired at the time of fabrication and the configuration of any test circuits therein cannot be changed. The tester IC 105 also includes a plurality of dedicated test circuits, which can be more efficient (e.g., in terms of area, speed, power consumption, etc.) than equivalent circuits configured in the general purpose programmable logic of an FPGA. Moreover, the dedicated test circuits in the tester IC 105 can include some test circuits that are difficult, impracticable, or impossible to implement using the general purpose programmable logic of an FPGA.

Figure 3:
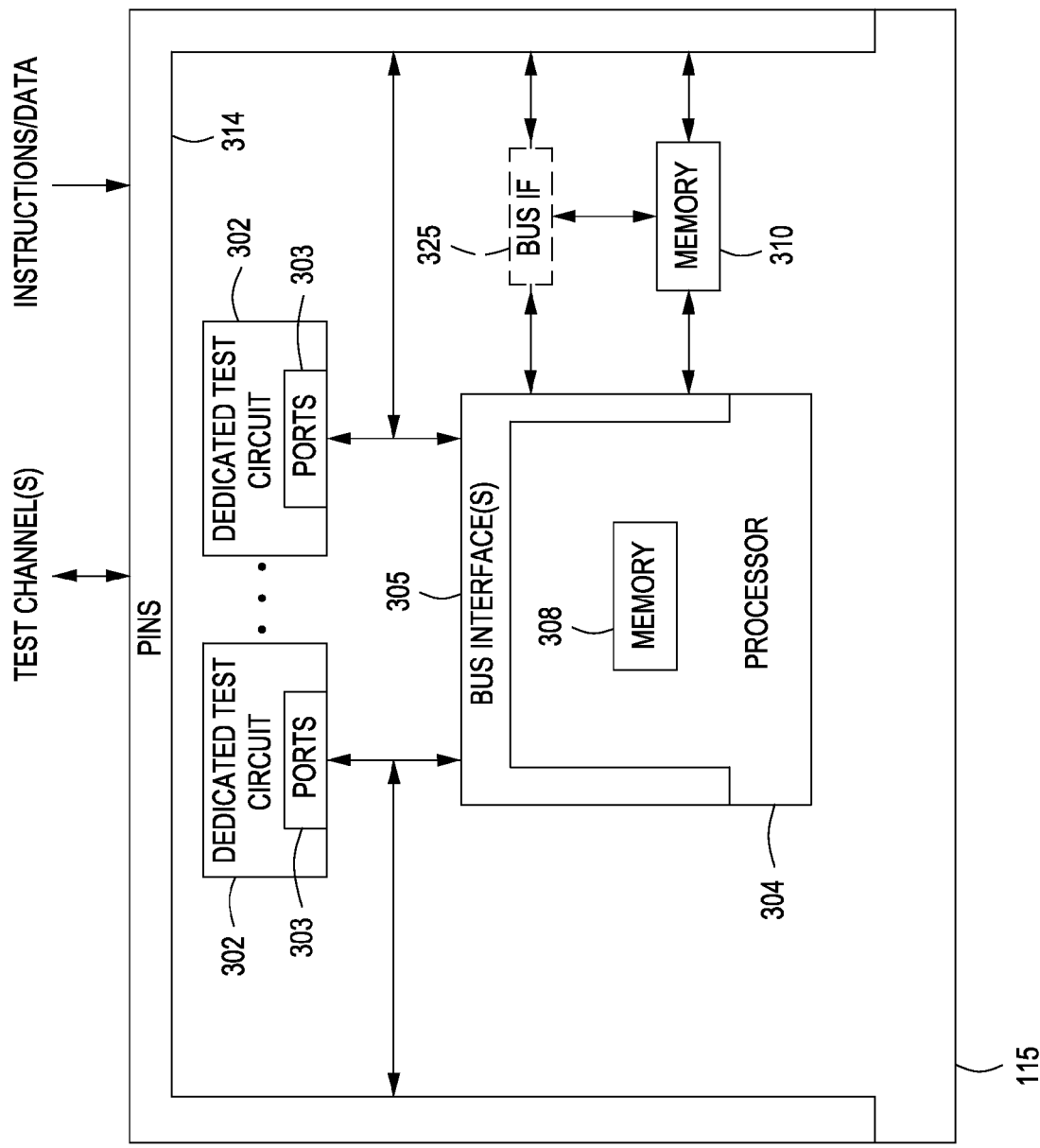
FIG. 3 is a block diagram depicting a tester IC according to some additional embodiments of the invention.

FIG. 3 is a block diagram depicting a tester IC 105 according to some additional embodiments of the invention. The tester IC 105 can include a plurality of dedicated test circuits 302 coupled to a processor 304. The dedicated test circuits 302 can be used to generate test signals for application to the DUT 112 and/or process test result signals received from the DUT 112. Each of the dedicated test circuits 302 can be defined in one or more layers (not shown) of the tester IC 105 during fabrication using photolithographic mask(s). Each of the dedicated test circuits 302 can include one or more ports 303 each of which is configured to provide output signals, receive input signals, or both.

The processor 304 can be a microprocessor, microcontroller, instruction-set processor, or like type device. The processor 304 can have at least one bus interface 305. At least a portion of the ports 303 of each of the dedicated test circuits 302 can be coupled to the bus interface(s) 305. In some embodiments, the processor 304 can include a memory 308. The memory 308 can store instructions and/or data used by the processor 304 (e.g., cache memory). In some embodiments, the test IC 105 can include a memory 310 external to the processor 304. The memory 310 can be coupled to the bus interface(s) 305 of the processor 304. The memory 310 can be used to store instructions and/or data for the processor 304. In some embodiments, the memory 310 can store any other data and can be accessed by other circuits through the processor 304, such as the dedicated test circuits 302.

The tester IC 105 can include pins 314, at least some of which are configured to provide output signals to test channels, receive input signals from test channels, or both. In some embodiments, at least a portion of the ports 303 of the dedicated test circuits 302 can be coupled to respective ones of the pins 314. In some embodiments, the pins 314 can be coupled to the bus interface(s) 305 of the processor 304. In other embodiments, the pins 314 can be coupled to bus interface logic 325 in the tester IC 105, which is in turn coupled to the bus interface(s) 305 of the processor 304. The bus interface logic 325 can be used as an interface between a particular type of bus provided externally to the tester IC and the particular bus interface(s) 305 of the processor 304. If present, the memory 310 can be coupled to the pins 314 either directly or through the bus interface logic 304. Instructions and/or data can be loaded to the memory 308 and/or the memory 310 through the pins 314 (optionally through the bus interface logic 325).

Instructions and/or data can be loaded into the memory 308 and/or the memory 310, where the instructions and/or data is/are designed to cause the processor to select one or more of the dedicated test circuits 302 for implementing tester logic. For example, the dedicated test circuits 302 may be initially inactive or otherwise unavailable for use. The processor 305 can execute instructions to activate or otherwise make available for use specific ones of the dedicated test circuits 302 to implement the tester logic. Communication between dedicated test circuits 302 can be handled by the processor 304. Once active or otherwise made available for use, the dedicated test circuits 302 can communicate with the test channels either directly via the pins 314, or indirectly through the processor 304. The instructions and/or data used by the processor 305 can be designed such that some dedicated test circuit(s) 302 remain inactive or otherwise unavailable for use. In this manner, those dedicated test circuits 302 that are not necessary for a given test application can be effectively isolated from those test circuits 302 that are required. This can minimize or eliminate any interference caused by unused dedicated test circuits 302. Various configurations of tester logic can be implemented to test DUTs across multiple test applications using the dedicated test circuits 302 as "building blocks".

The dedicated test circuits 302 can include multiple types of test circuits. Non-limiting examples of test circuits that can be implemented as the dedicated test circuits 302 include timing generators and/or timing counters, formatters, DUT interfaces (e.g., memory interfaces, processor interfaces, system on chip (SoC) interfaces, and the like), IO circuits (e.g., drivers, comparators, etc.), and algorithmic pattern generators (APGs). Various other types of circuits that can be used to test a DUT can be implemented as one or more of the dedicated test circuits 302.

The dedicated test circuits 302 can include multiple versions of a specific type of test circuit. In a non-limiting example, the dedicated test circuits 302 can include multiple versions of an IO circuit for communicating with a DUT, each designed to handle a different voltage. In another non-limiting example, the dedicated test circuits 302 can include multiple versions of an APG, each designed to generate test patterns for different DUTs. In such embodiments, the specific attribute or attributes that differ among the multiple versions of a specific test circuit are hard-wired (dedicated) within the test circuit.

In some embodiments, one or more of the dedicated test circuits 302 can be programmable. For example, the processor 305, via instructions and/or data, can control or otherwise program one or more attributes thereof. In a non-limiting example, the dedicated test circuits 302 can include an IO circuit for communicating with a DUT, where the IO voltage of the IO circuit can be programmed during testing (e.g., the IO voltage can be selected from a plurality of possible IO voltages). In another non-limiting example, the dedicated test circuits 302 can include an APG that can be programmed to produce different test patterns potentially across different types of DUTs. Various other types of test circuits can be implemented in the dedicated test circuits 302 to have one or more programmable attributes.

In some embodiments, the instructions and/or data stored in the memory 308 and/or the memory 310 can be designed such that specific ones of the dedicated test circuits 302 become active/usable and inactive/unusable dynamically while the tester IC 105 is active (e.g., during testing). Thus, different ones of the dedicated test circuits 302 can be incorporated and/or unincorporated into the tester logic dynamically during the testing process.

The tester IC 105 can exhibit advantages over an ASIC tester IC or an FPGA tester IC. The tester IC 105 includes a programmable processor, which allows for specific configurations of dedicated test circuits to be selected (and reselected), in some embodiments dynamically, for particular test applications. In contrast, an ASIC tester IC is hard-wired at the time of fabrication and the configuration of any test circuits therein cannot be changed. The tester IC 105 also includes a plurality of dedicated test circuits, which can be more efficient (e.g., in terms of area, speed, power consumption, etc.) that equivalent circuits configured in the general purpose programmable logic of an FPGA. Moreover, the dedicated test circuits in the tester IC 105 can include some test circuits that are difficult, impracticable, or impossible to implement using the general purpose programmable logic of an FPGA.

Figure 4:
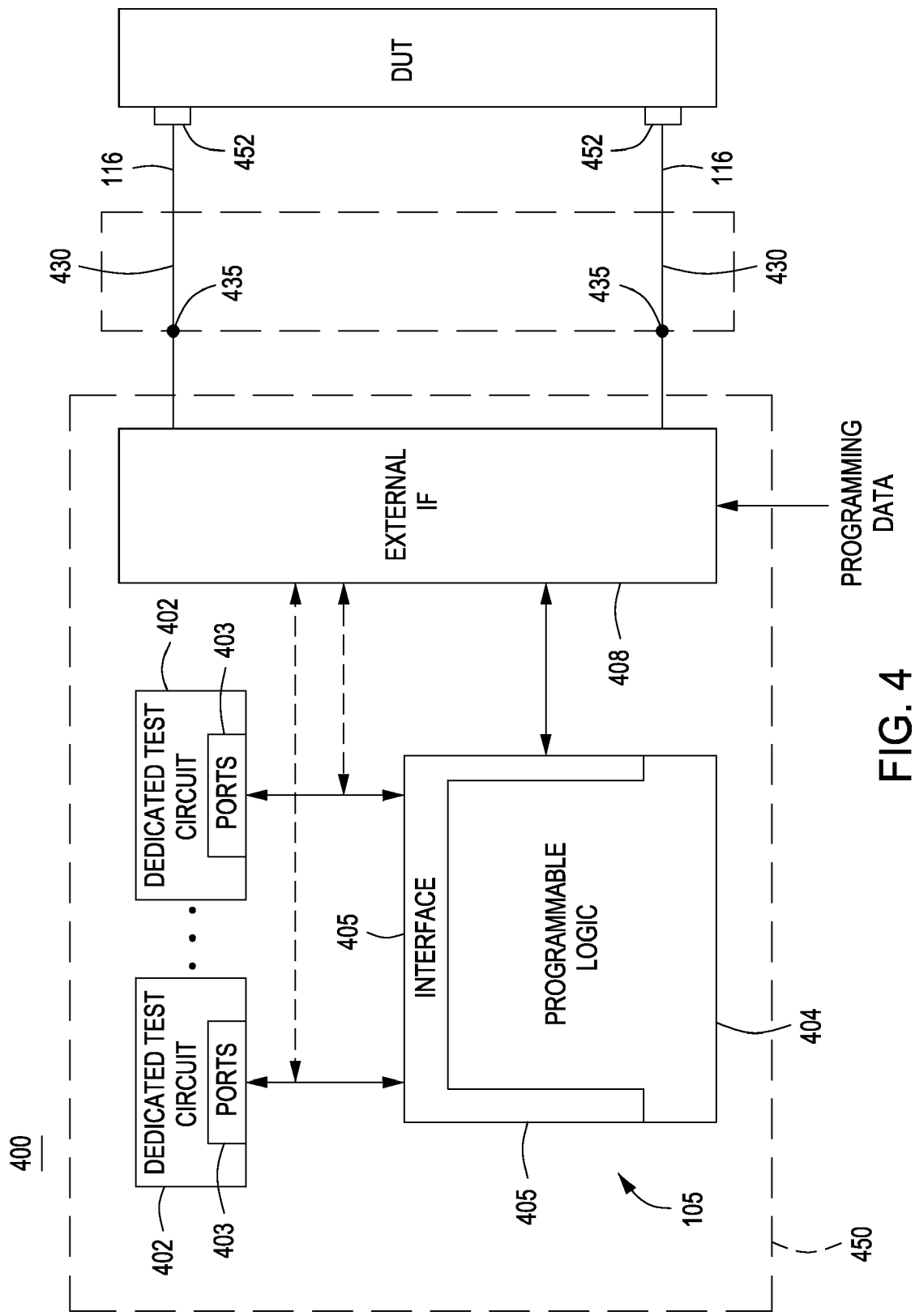
FIG. 4 is a block diagram depicting a test system according to some embodiments of the invention.

FIG. 4 is a block diagram depicting a test system 400 according to some embodiments of the invention. The test system 400 can include a tester 450 coupled to test probes 116. The test probes 116 can be configured to contact pads 452 on the DUT 112. The tester 450 can be implemented using components within a tester IC 105. Exemplary non-limiting embodiments of a tester IC 105 are shown above with respect to FIGS. 2 and 3. More generalized embodiments of the tester IC 105 are shown in FIG. 4.

The tester IC 105 can include a plurality of dedicated test circuits 402, programmable logic 404, and an external interface 408. The dedicated test circuits 402 can be used to generate test signals for application to the DUT 112 and/or process test result signals received from the DUT 112. Each of the dedicated test circuits 402 can be defined in one or more layers (not shown) of the tester IC 105 during fabrication using photolithographic mask(s). Each of the dedicated test circuits 402 can include one or more ports 403 each of which is configured to provide output signals, receive input signals, or both.

The programmable logic 404 can include an interface 405. At least a portion of the ports 403 of each of the dedicated test circuits 402 can be coupled to the interface 405 of the programmable logic 404. The programmable logic 404 can be responsive to programming data to select one or more of the dedicated test circuits 402 for implementation of the tester 450. The interface 405 of the programmable logic 404 can be further coupled to the external interface 408. In some embodiments, the external interface 408 can include pins of the tester IC 105. In other embodiments, the external interface 408 can include bus interface logic and pins of the tester IC 105. In some embodiments, the dedicated test circuits 402 can also be coupled directly to the external interface 408.

The external interface 408 can provide an interface between the programmable logic 404 and test channels 430. The test channels 430 may be implemented on the probe card assembly 114 using signal paths, as described above. The external interface 408 can be coupled to input terminals 435 of the test channels 430. The test channels 430 can be coupled to the test probes 116. During testing, the test probes 116 can contact the pads 452 of the DUT 112, allowing the tester 450 to provide test signals to, and receive test result signals from, the DUT 112.

The programmable logic 404 can include logic capable of being programmed to select one or more of the dedicated test circuits 402 responsive to the programming data. The programming data may be provided to the programmable logic 404 via the external interface 408 and the interface 405. If a given dedicated test circuit 402 is selected by the programmable logic 404, such dedicated test circuit 402 becomes part of the implementation of the tester 450 and is capable of performing its function. Some embodiments of the programmable logic 404 are described above. For example, in some embodiments, the programmable logic 404 can include a programmable interconnect fabric capable of being configured to connect one or more of the dedicated test circuits 402 to each other and/or to the external interface 408. The programming data can comprise configuration data to be stored in configuration memory of the programmable interconnect fabric. In some embodiments, the programmable logic 404 can include a processor capable of selecting one or more of the dedicated test circuits 402 to be active or otherwise capable of being used. The programming data can comprise instructions and/or data stored in a memory for execution and/or processing by the processor. In some embodiments, the programmable logic 404 can include a combination of a programmable interconnect fabric and a processor. The programmable logic 404 can include other types of logic in place of or in addition to the programmable interconnect fabric and/or the processor, such other logic being designed to implement the functionality of the programmable logic as described above.

Figure 5:
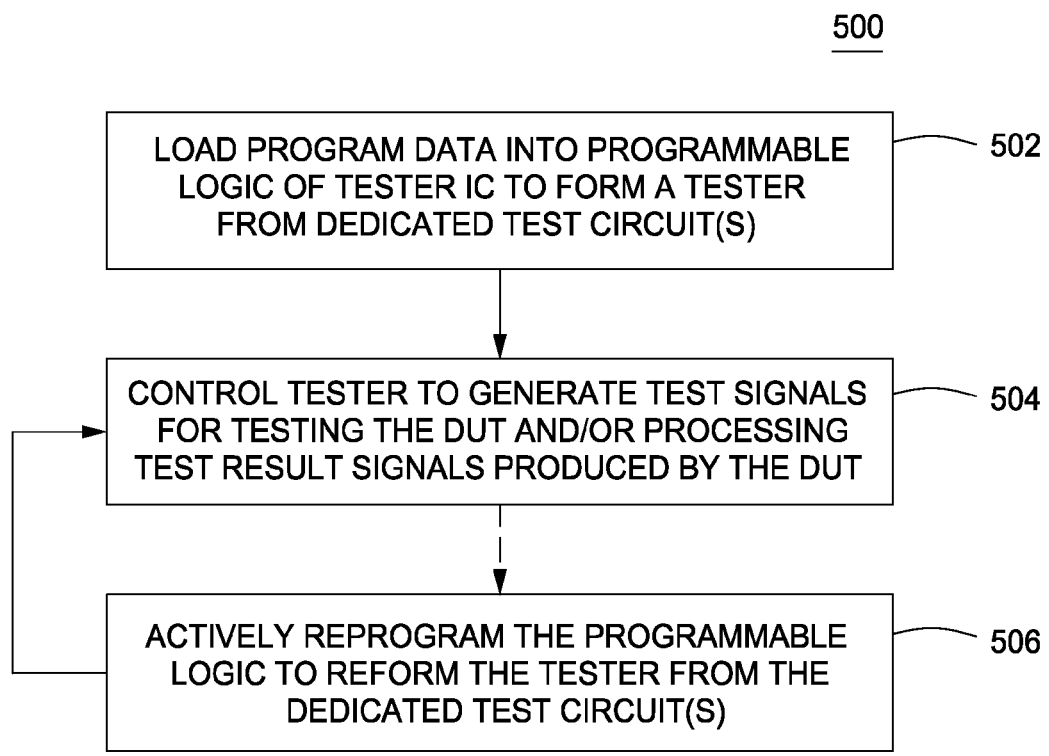
FIG. 5 is a flow diagram depicting a method of testing a device under test according to some embodiments of the invention.

FIG. 5 is a flow diagram depicting a method 500 of testing a device under test according to some embodiments of the invention. Programming data can be loaded into programmable logic of a tester IC (502). The programming data can program the programmable logic to form a tester from at least one of a plurality of dedicated test circuits in the tester IC. In some embodiments, the programmable logic can include a programmable interconnect fabric and the programming data can include configuration data to be loaded into configuration memory of the programmable interconnect fabric. The configuration data can program the programmable interconnect fabric to select one or more of the dedicated test circuits for implementing the tester. In other embodiments, the programmable logic can include a processor and the programming data can include instructions and/or data to be executed and/or processed by the processor. The instructions and/or data can cause the processor to select one or more of the dedicated test circuits for implementing the tester.

The tester can be controlled to generate a test signal for testing the DUT and/or processing a test result signal produced by the DUT (504). In some embodiments, the programmable logic can be actively reprogrammed to reform the tester from the dedicated test circuits (506). The reprogramming can be "active" in that the reprogramming can occur while the tester IC is active and in the process or testing the DUT. For example, if the programmable logic includes a programmable interconnect fabric, the configuration data can be at least partially updated to dynamically reconfigure the programmable interconnect fabric to modify the selection of the dedicated test circuits (e.g., different test circuits can be selected and other test circuits can be unselected). If the programmable logic includes a processor, the instructions and/or data can be configured to cause the processor to select new dedicated test circuits and/or unselect dedicated test circuits for the tester implementation. The method 500 can return to controlling the tester to produce test signals and/or processing test result signals given the reprogrammed tester implementation (504). The process of controlling the tester and reprogramming the tester can be repeated one or more times until testing is complete.

While the foregoing is directed to embodiments of the present invention, other and further embodiments of the invention may be devised without departing from the basic scope thereof, and the scope thereof is determined by the claims that follow.

The invention claimed is:

1. Apparatus for testing a semiconductor device under test (DUT), comprising:
   an integrated circuit (IC) coupled to test probes configured to contact pads on the DUT, the IC including a plurality of dedicated test circuits coupled to programmable logic, the programmable logic responsive to programming data to form a tester for testing the DUT from at least one of the dedicated test circuits by selectively connecting the at least one of the dedicated test circuits to at least one of the test probes while selectively disconnecting at least another one of the dedicated test circuits from the test probes,
   wherein each of a plurality of the dedicated test circuits is configured to perform a different test on the DUT.

2. Apparatus for testing a semiconductor device under test (DUT), comprising:
   an integrated circuit (IC) coupled to test probes configured to contact pads on the DUT, the IC including a plurality of dedicated test circuits coupled to programmable logic, the programmable logic responsive to programming data to form a tester for testing the DUT from at least one of the dedicated test circuits,
   wherein the programmable logic comprises a programmable interconnect fabric, and wherein the dedicated test circuits are coupled to input/output (IO) ports of the programmable interconnect fabric.

3. The apparatus of claim 2, wherein the programmable interconnect fabric includes a configuration memory, and wherein the programming data includes configuration data, stored in the configuration memory, for controlling programmable interconnections of conductor segments in the programmable interconnect fabric.

4. The apparatus of claim 3, wherein the programmable logic further comprises a processor coupled to the IO ports of the programmable interconnect fabric.

5. The apparatus of claim 4, wherein the processor is configured to control storage of the configuration data in the configuration memory.

6. The apparatus of claim 1, wherein the programmable logic includes a processor, and wherein the dedicated test circuits are coupled to a bus interface of the processor.

7. The apparatus of claim 6, wherein the processor communicates with a memory, and wherein the programming data includes instructions stored in the memory and being executable by the processor.

8. Apparatus for testing a semiconductor device under test (DUT), comprising:
   a probe card assembly having input terminals coupled to test probes via signal paths, the test probes configured to contact pads on the DUT; and
   test instruments, coupled to the input terminals, the test instruments including at least one tester integrated circuit (IC), each of the at least one tester IC coupled to one or more of the input terminals and including:
   a plurality of dedicated test circuits coupled to programmable logic, the programmable logic responsive to programming data to form a tester for testing the DUT from at least one of the dedicated test circuits by selectively connecting the at least one of the dedicated test circuits to at least one of the test probes while selectively disconnecting at least another one of the dedicated test circuits from the test probes, wherein each of a plurality of the dedicated test circuits is configured to perform a different test on the DUT.

9. Apparatus for testing a semiconductor device under test (DUT), comprising:
an integrated circuit (IC) coupled to test probes configured to contact pads on the DUT, the IC including a plurality of dedicated test circuits coupled to programmable logic, the programmable logic responsive to programming data to form a tester for testing the DUT from at least one of the dedicated test circuits,
wherein the programmable logic comprises a programmable interconnect fabric, and wherein the dedicated test circuits are coupled to input/output (TO) ports of the programmable interconnect fabric.

10. The apparatus of claim 9, wherein the programmable interconnect fabric includes a configuration memory, and wherein the programming data includes configuration data, stored in the configuration memory, for controlling programmable interconnections of conductor segments in the programmable interconnect fabric.

11. The apparatus of claim 10, wherein the programmable logic further comprises a processor coupled to the IO ports of the programmable interconnect fabric.

12. The apparatus of claim 11, wherein the processor is configured to control storage of the configuration data in the configuration memory.

13. The apparatus of claim 8, wherein the programmable logic includes a processor, and wherein the dedicated test circuits are coupled to a bus interface of the processor.

14. The apparatus of claim 13, wherein the processor communicates with a memory, and wherein the programming data includes instructions stored in the memory and being executable by the processor.

15. A probe card assembly, comprising:
signal paths coupled to test probes, the test probes configured to contact pads on a semiconductor device under test (DUT); and
at least one tester integrated circuit (IC) coupled one or more of the signal paths and including:
a plurality of dedicated test circuits coupled to programmable logic, the programmable logic responsive to programming data to form a tester for testing the DUT from at least one of the dedicated test circuits by selectively connecting the at least one of the dedicated test circuits to at least one of the test probes while selectively disconnecting at least another one of the dedicated test circuits from the test probes,
wherein each of a plurality of the dedicated test circuits is configured to perform a different test on the DUT.

16. Apparatus for testing a semiconductor device under test (DUT), comprising:
an integrated circuit (IC) coupled to test probes configured to contact pads on the DUT, the IC including a plurality of dedicated test circuits coupled to programmable logic, the programmable logic responsive to programming data to form a tester for testing the DUT from at least one of the dedicated test circuits,
wherein the programmable logic comprises a programmable interconnect fabric, and wherein the dedicated test circuits are coupled to input/output (IO) ports of the programmable interconnect fabric.

17. The probe card assembly of claim 16, wherein the programmable interconnect fabric includes a configuration memory, and wherein the programming data includes configuration data, stored in the configuration memory, for controlling programmable interconnections of conductor segments in the programmable interconnect fabric.

18. The probe card assembly of claim 17, wherein the programmable logic further comprises a processor coupled to the IO ports of the programmable interconnect fabric.

19. The probe card assembly of claim 15, wherein the programmable logic includes a processor, and wherein the dedicated test circuits are coupled to a bus interface of the processor.

20. The probe card assembly of claim 19, wherein the processor communicates with a memory, and wherein the programming data includes instructions stored in the memory and being executable by the processor.

21. The apparatus of claim 1, wherein one or more of the at least one of the dedicated test circuits selectively connected to the at least one of the test probes is configured to perform a different test on the DUT than one or more of the at least another one of the dedicated test circuits selectively disconnected from the test probes.

22. The apparatus of claim 8, wherein one or more of the at least one of the dedicated test circuits selectively connected to the at least one of the test probes is configured to perform a different test on the DUT than one or more of the at least another one of the dedicated test circuits selectively disconnected from the test probes.

23. The probe card assembly of claim 15, wherein one or more of the at least one of the dedicated test circuits selectively connected to the at least one of the test probes is configured to perform a different test on the DUT than one or more of the at least another one of the dedicated test circuits selectively disconnected from the test probes.

* * * * *